United States Patent
Lee

Patent Number: 6,156,618
Date of Patent: Dec. 5, 2000

[54] METHOD FOR FABRICATING THIN FILM RESISTOR

[75] Inventor: Jia Sheng Lee, Hsin-Chu, Taiwan

[73] Assignee: United Microelectronics Corp., Hsin-Chu, Taiwan

[21] Appl. No.: 09/277,881

[22] Filed: Mar. 29, 1999

[51] Int. Cl.[7] .......................... H01L 21/331; H01L 21/20
[52] U.S. Cl. .......................... 438/381; 430/382; 430/723; 430/724; 430/757
[58] Field of Search .................................... 438/381, 382, 438/384, 383, 629, 706, 723, 724, 757

[56] References Cited

U.S. PATENT DOCUMENTS

| | | | |
|---|---|---|---|
| 5,420,053 | 5/1995 | Miyazaki | 438/330 |
| 5,420,063 | 5/1995 | Maghsondnia et al. | 438/384 |
| 5,547,896 | 8/1996 | Linn et al. | 438/384 |
| 5,567,644 | 10/1996 | Rolfson et al. | 438/384 |
| 5,585,302 | 12/1996 | Li | 438/674 |
| 5,976,943 | 11/1999 | Manley et al. | 438/382 |

*Primary Examiner*—Benjamin L. Utech
*Assistant Examiner*—Duy-Vu Deo
*Attorney, Agent, or Firm*—Harness, Dickey & Pierce, P.L.C.

[57] ABSTRACT

A method for forming thin film resistor with tungsten plug is disclosed. The Method includes the following steps. This method comprises firstly providing a semiconductor device with contact regions wherein a metal barrier layer is formed on top surface of the device. Then forming tungsten layer on the inter-layer dielectric and etching back are carried out until stopping on the barrier metal. Consequentially an inter-layer dielectric is formed on top of said surface of semiconductor device. The next, band layer is formed on the inter-layer dielectric. Nitride layer will be deposited onto said thin film resistor. Portions of said nitride layer and the inter-layer dielectric are all removed. The band layer is patterned to define as contact plug. Forming the inter-layer dielectric over top surface of semiconductor device is achieved. Sequentially anisotropically etching back the inter-layer dielectric to form contact plug. Simultaneously, anisotropically etching back the silicon nitride layer. Inter-layer dielectric that is over top surface of the semiconductor device is removed. Forming metal layer over top surface of the semiconductor is carried out. Then metal layer fills the contact plug. A photoresist layer is formed on the metal layer and also photoresist layer will define this metal area. Finally not only removing portions of the metal layer left uncovered by the photoresist layer, but also removing the photoresist layer are entirely completed.

10 Claims, 4 Drawing Sheets

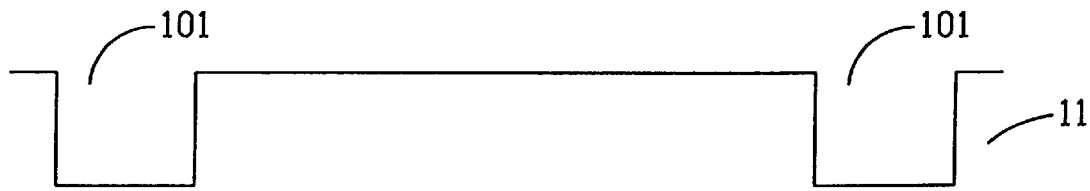
FIG.1A
FIG.1B
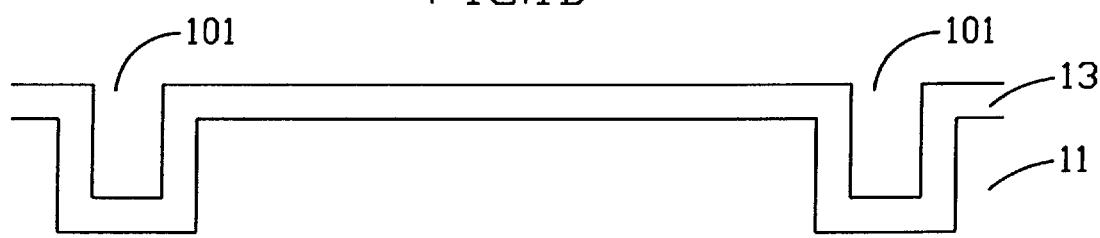
FIG.1C
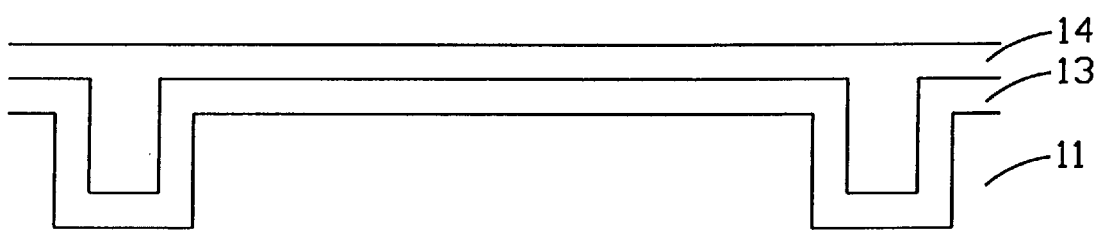
FIG.1D
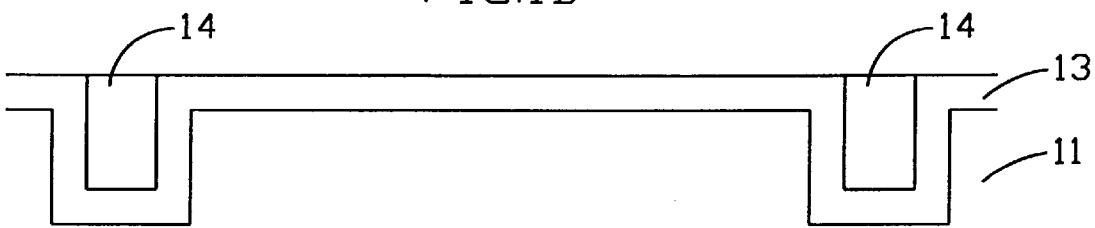
FIG.1E
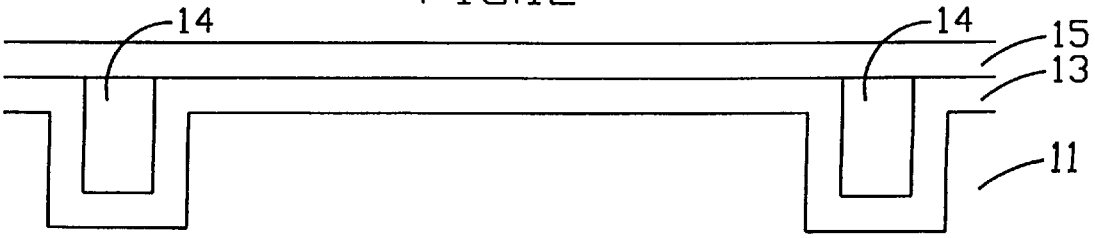
FIG.1F

METHOD FOR FABRICATING THIN FILM RESISTOR

BACKGROUND OF THE INVENTION

1. Field of the Invention

The present invention relates to the fabrication method of thin film resistor, and more particularly to combine forming tungsten-plug and thin film resistor.

2. Description of the Prior Art

Current technology for connecting to thin film resistors falls primarily into two categories. Normally the first utilizes lift-off metallic interconnects, and the second utilizes etched metallic interconnects with an inter-level dielectric and etched vias. Generally resistive thin films often is used as resistors in semiconductor device applications. These resistor films can be sputtered or evapourated onto a wafer and then etched selectively. These resistor films can be delineated by means of a photoresist lift-off process, alternately.

Generally, in the life-off interconnect process, a thin film resistor will be defined by etching or lift-off process. Photoresist is applied and patterned firstly, and then leaving the contact regions of the resistor exposed. Consequentially a metallic layer for the inter-connect is deposited and unwanted portions are lifted off. This process is straightforward but can be used only in limited applications wherein the metallic interconnects can be defined by lift-off. Furthermore, in the etched interconnect process, thin film resistor is formed by etching or lift-off process as well. Photoresist is used to deposit protective metal over the contact regions of the resistor. This sort of metal is not only for the metallic inter-connect, but also is used instead to protect the thin film resistor during subsequent via etching.

After that, an inter-level dielectric is then deposited, followed by patterning and etching of vias in the dielectric, also stopping on the protective metal over the thin film resistor. Finally the metallic interconnect material is deposited and etched.

SUMMARY OF THE INVENTION

In accordance with the present invention, a method is provided for forming thin film resistor. This method comprises firstly providing a semiconductor device with contact regions wherein a metal barrier layer is formed on top surface of the device. Then forming tungsten layer on the inter-layer dielectric and etching back are carried out until stopping on the barrier metal. Consequentially an inter-layer dielectric is formed on top of said surface of semiconductor device. The next, band layer is formed on the inter-layer dielectric. Nitride layer will be deposited onto the band layer. Portions of said nitride layer and the inter-layer dielectric are all removed. The band layer is patterned to define as contact plug. Forming the inter-layer dielectric over top surface of semiconductor device is achieved. Sequentially anisotropically etching bsck the inter-layer dielectric to form contact plug. Simultaneously, anisotropically etching back the silicon nitride layer. Inter-layer dielectric that is over top surface if the semiconductor device is removed. Forming metal layer over top surface of the semiconductor is carried out. Then metal layer fills the contact plug. A photoresist layer is formed on the metal layer and also photoresist layer will define this metal area. Finally not only removing portions of the metal layer left uncovered by the photoresist layer, but also removing the photoresist layer are entirely completed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The fabrication method of film resistor for the present invention is applied to a broad range of film resistor and be fabricated from a variety of semiconductor. The following description discusses several presently preferred embodiments of the film resistor of the present invention as implemented in silicon wafer, since the majority of currently available film resistor are fabricated in the conventional method and the most commonly encountered applications of the present invention will involve new structure. Nevertheless, the present invention may also be advantageously employed in silicon, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to the film resistor, it is not intended that these illustrations be a limitation on the scope or applicability of the present invention. Thus, it is not intended that the semiconductor devices of the present invention be limited to the structures illustrated. These devices are included to demonstrate the utility and application of the present intention to presently preferred embodiments.

Figure 1G:
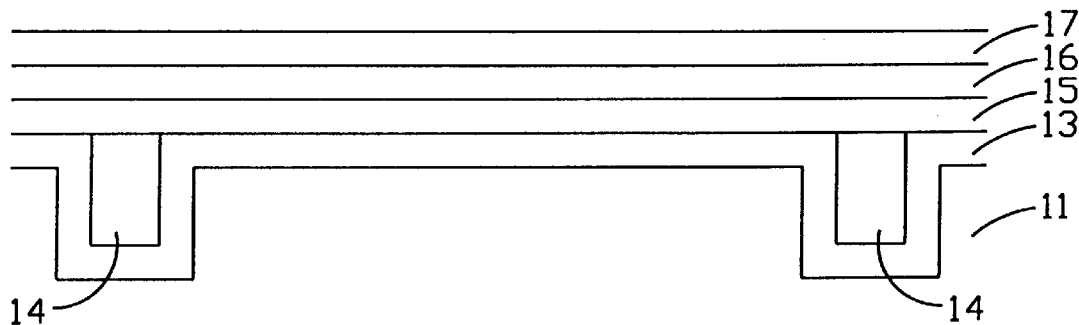
FIGS. 1A to 1O are sectional views showing in combination an embodiment of the present invention.
Figure 1H:
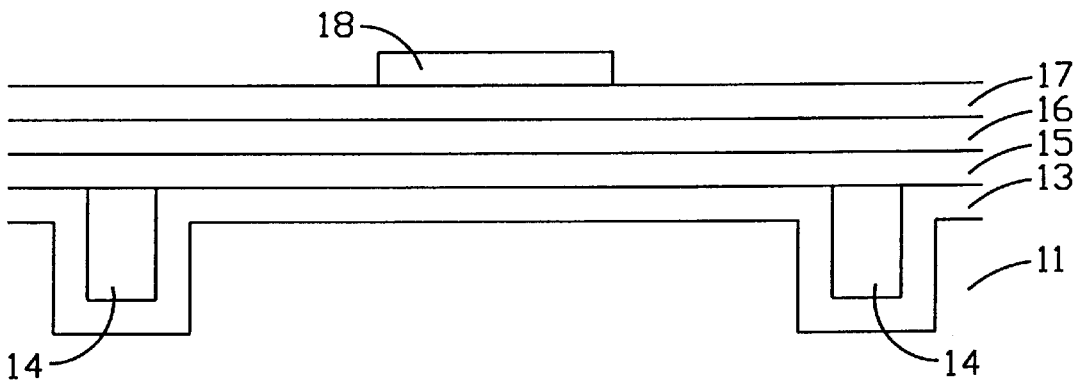
Figure 1I:
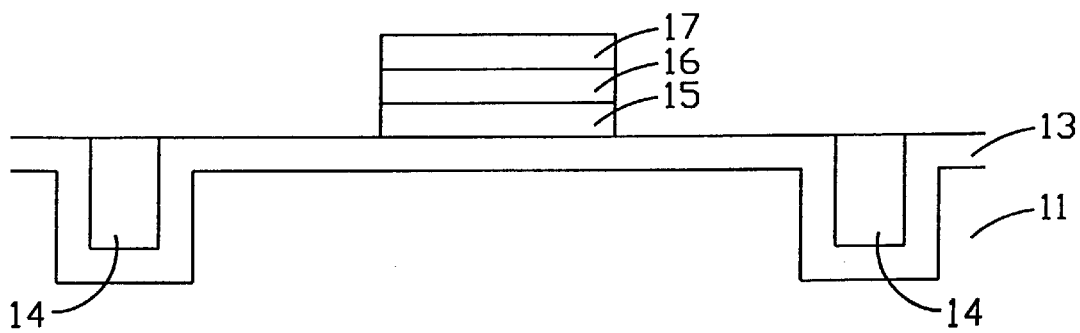
Figure 1J:
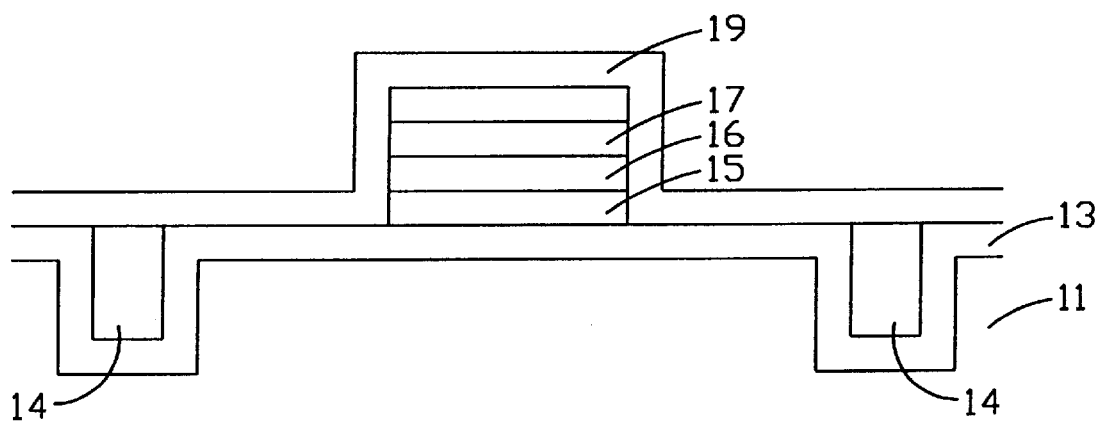
Figure 1K:
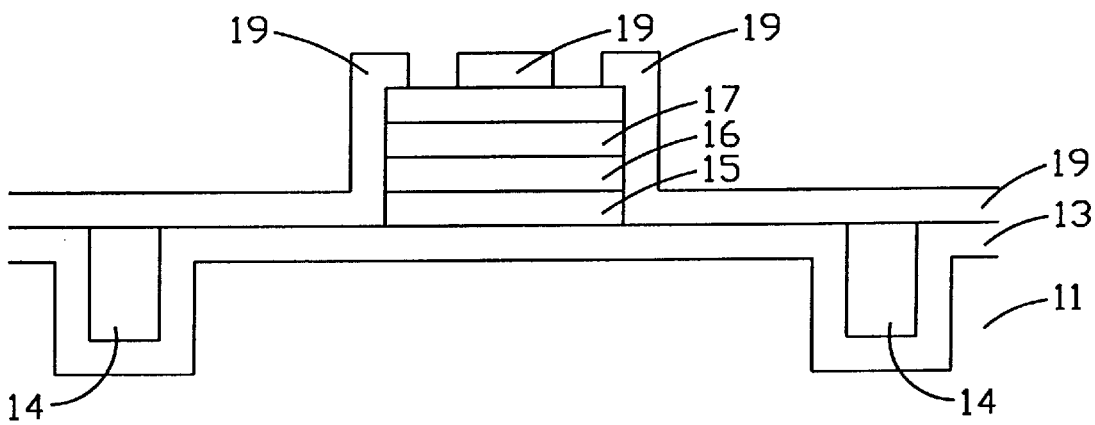
Figure 1L:
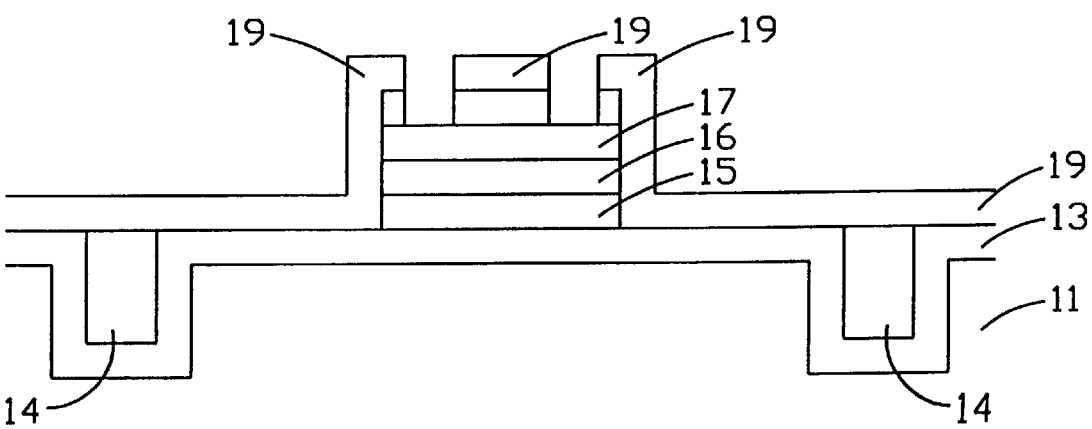
Figure 1M:
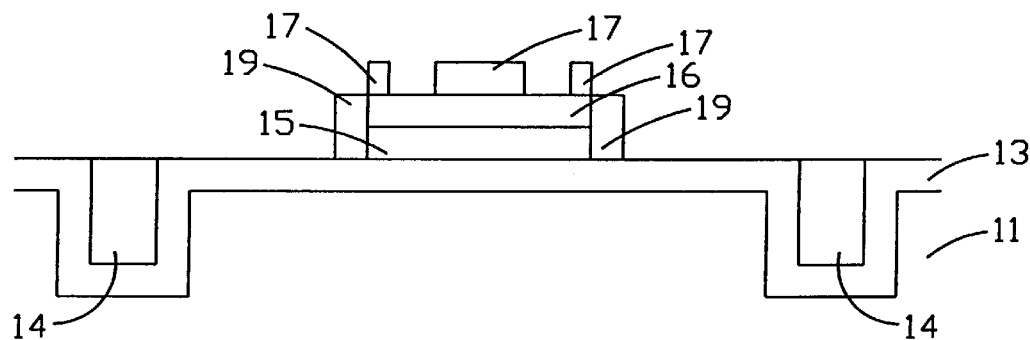
Figure 1N:
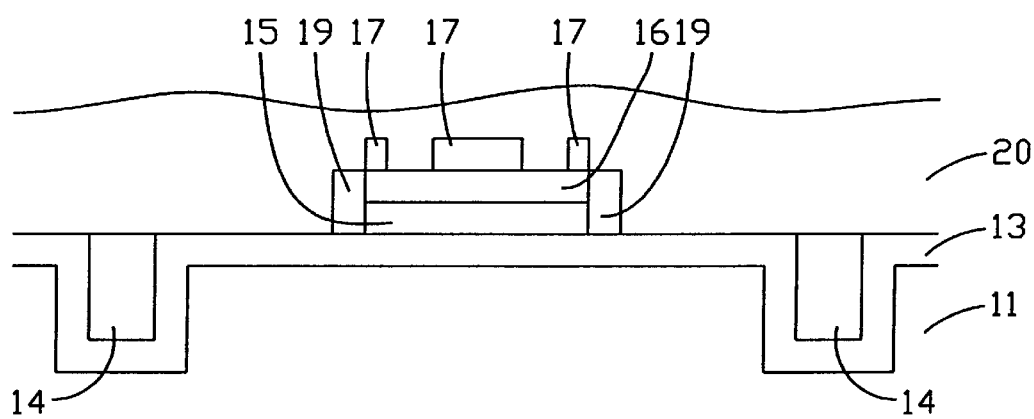
Figure 1O:
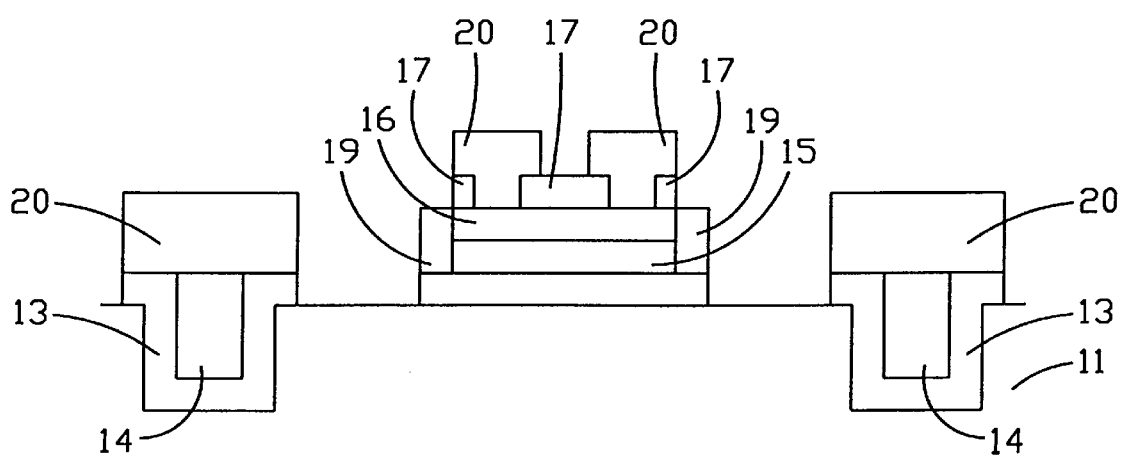

Firstly as FIG. 1A there is a semiconductor device 11 such as inter-layer dielectrics, usually used as boron, phosphate silicon glass, provided and sequentially contact 101 is formed into the above device 11 shown as FIG. 1B. FIG. 1C illustrates barrier metal layer 13 is sputtered onto the above device 11 using PVD method. Then, as FIG. 1D; tungsten layer 14 is deposited onto barrier metal layer 13 using traditional CVD method. Thereafter, etching back process is carried out and it will stop on barrier metal 13 as FIG. 1E. Consequentially FIG. 1F illustrates silicon oxide layer being deposited onto surface of semiconductor device. Then band layer 16 such as polysilicon and silicon nitride layer 17 is deposited as FIG. 1G. The next, FIG. 1H, band layer 16 is defined using lithography method. FIG. 1I shows that estimated part of silicon oxide layer 15, band layer 16 and silicon nitride layer 17 being removed. Then silicon oxide layer 19 is deposited onto the surface of device as FIG. 1J. Again, band layer 16 is defined as contact using lithography method and the estimated past of silicon oxide layer 19 is etched shown as FIG. 1K. Then, as FIG. 1L the estimated part of silicon nitride 17 is etched using hot $H_3PO_3$ solution. FIG. 1M, a dramatic picture showing silicon oxide layer 19 on the surface of semiconductor device is totally removed. Sequentially metal 21 such as aluminum is sputtered onto the surface of semiconductor device dedicated as FIG. 1N. Finally, metal 21 is defined as the estimated shape as FIG. 1O.

Therefore according to the above statement, a method for forming thin film resistor combining with tungsten-plug will comprise the following steps. Firstly providing a semiconductor device with contact regions is carried out, this metal barrier layer is formed on top surface of the device. Tungsten layer is formed on the inter-layer dielectric and etching back until stopping on the barrier metal. Then forming an inter-layer dielectric on top of the surface of semiconductor device is carried out. Sequentially band layer is formed on the inter-layer dielectric. Nitride layer deposited onto the thin film resistor ad well. Removing parts of the nitride layer and the inter-layer dielectric are achieved. The band layer patterned in order to define as contact plug. Thereafter the inter-layer dielectric is formed over top surface of semiconductor device and anisotropically etched back the inter-layer dielectric to form contact plug. Simultaneously, anisotropically etching back the silicon nitride layer. Inter-layer. Dielectric is removed over top surface of the semiconductor device. The metal layer is sputtered over top surface of the semiconductor, wherein the metal layer fills the contact plug. Pattering the metal layer is achieved to define as plug. Then portions of the metal layer are removed left uncovered by the above pattering process, and the photoresist layer removed. The contact plug can be formed by using plasma etching method.

Therefore forming thin film resistor will consist the following steps. Firstly forming a photoresist layer on the band layer, then photoresist layer defines a band layer area and portions of the thin film resistor is removed left uncovered by the photoresist layer; and removing the photoresist layer is carried out. In addition, oxide layer can be formed using chemical vapour deposition method. Also the nitride layer can be etched using hot $H_3PO_3$ solution. The tungsten layer will be formed by chemical vapour deposition.

Although specific embodiments have been illustrated and described, it will be obvious to those skilled in the art that various modifications may be made without departing from what is intended to be limited solely by the appended claims.

What is claimed is:

1. A method for forming thin film resistor, the method comprising:

providing an inter-layer dielectric having contact regions wherein a barrier metal layer is formed on top surface of said dielectric;

forming a tungsten layer on said inter-layer dielectric and etching back until stopping on said barrier metal;

forming an inter-layer dielectric on said top surface of the thin-film resistor;

forming a band layer on said inter-layer dielectric;

depositing a silicon nitride layer onto said band layer;

removing parts of said nitride layer and said inter-layer dielectric;

patterning said band layer to define as contact plug;

forming an inter-layer dielectric over the top surface of the thin-film resistor;

anisotropically etching back said inter-layer dielectric to form contact plug;

simultaneously anisotropically etching back said silicon nitride layer;

removing inter-layer dielectric which is over said top surface of the thin-film resistor;

forming a metal layer over top surface of the thin-film resistor, wherein said metal layer fills said contact plug;

forming a photoresist layer on said metal layer, wherein said photoresist layer defines metal area;

removing portions of said metal layer left uncovered by said photoresist layer; and removing said photoresist layer.

2. The method according to claim 1, wherein said contact plug can be formed by using plasma etching method.

3. The method according to claim 1, wherein said forming tungsten layer comprises chemical vapour deposition.

4. The method according to claim 1, wherein said method for forming band layer comprising;

forming a photoresist layer on said thin film resistor, wherein said first photoresist layer defines a band layer area;

removing portions of said band layer left uncovered by said photoresist layer; and removing said first photoresist layer.

5. A method for forming thin film resistor combining with tungsten-plug, the method comprising:

providing an inter-layer dielectric having contact regions wherein a barrier metal layer is formed on top surface of said dielectric;

forming a tungsten layer on said inter-layer dielectric and etching back until stopping on said barrier metal;

forming an inter-layer dielectric on top of said surface of the thin-film resistor;

forming a band layer on said inter-layer dielectric;

depositing a silicon nitride layer onto said band layer;

removing parts of said nitride layer and said inter-layer dielectric;

patterning said band layer to define as contact plug;

forming an inter-layer dielectric over top surface of the thin film resistor;

anisotropically etching back said inter-layer dielectric to form contact plug;

simultaneously anisotropically etching back said silicon nitride layer;

removing inter-layer dielectric which is over top surface of the thin film resistor;

sputtering metal layer over top surface of the thin film resistor, wherein said metal layer fills said contact plug;

patterning said metal layer to define as plug; and removing portions of said metal layer left uncovered by said pattering process.

6. The method according to claim 5, wherein said contact plug can be formed by using plasma etching method.

7. The method according to claim 5, wherein said method for forming thin film resistor comprising:

forming a photoresist layer on said band layer, wherein said photoresist layer defines said band layer area;

removing portions of said band layer left uncovered by said photoresist layer; and removing said photoresist layer.

8. The method according to claim 5, wherein said oxide layer can be formed using chemical vapour deposition.

9. The method according to claim 5, wherein said nitride layer can be etched using hot $H_3PO_3$ solution.

10. The method according to claim 5, wherein said forming tungsten layer comprising chemical vapour deposition.

* * * * *